US008614390B2

(12) United States Patent
Watts

(10) Patent No.: US 8,614,390 B2
(45) Date of Patent: Dec. 24, 2013

(54) AUTOMATIC CONFIGURATION OF THERMOELECTRIC GENERATION SYSTEM TO LOAD REQUIREMENTS

(75) Inventor: Phillip C. Watts, Longmont, CO (US)

(73) Assignee: Watts Thermoelectric, LLC, Aspen, CO (US)

(*) Notice: Subject to any disclaimer, the term of this patent is extended or adjusted under 35 U.S.C. 154(b) by 1171 days.

(21) Appl. No.: 12/481,750

(22) Filed: Jun. 10, 2009

(65) Prior Publication Data
US 2009/0301539 A1 Dec. 10, 2009

Related U.S. Application Data

(60) Provisional application No. 61/060,377, filed on Jun. 10, 2008.

(51) Int. Cl.
H01L 35/30 (2006.01)

(52) U.S. Cl.
USPC .......................................................... 136/205

(58) Field of Classification Search
USPC .................................. 136/201, 205; 323/299
See application file for complete search history.

(56) References Cited

U.S. PATENT DOCUMENTS

| 3,197,342 | A | * | 7/1965 | Neild, Jr. ...................... 136/210 |
| 4,007,728 | A | * | 2/1977 | Guba ............................ 126/667 |
| 4,099,381 | A | | 7/1978 | Rappoport |
| 4,290,273 | A | | 9/1981 | Meckler |
| 6,028,263 | A | | 2/2000 | Kobayashi et al. |
| 6,244,264 | B1 | * | 6/2001 | Winston ........................ 126/652 |
| 7,100,369 | B2 | | 9/2006 | Yamaguchi et al. |
| 7,608,777 | B2 | | 10/2009 | Bell et al. |
| 2007/0261729 | A1 | | 11/2007 | Hu |
| 2008/0041054 | A1 | | 2/2008 | Montesinos |
| 2008/0168775 | A1 | | 7/2008 | Windheim et al. |

* cited by examiner

Primary Examiner — Tamir Ayad
(74) Attorney, Agent, or Firm — Kilpatrick Townsend & Stockton LLP

(57) ABSTRACT

Apparatus and methods for automatically configuring a thermoelectric power generation system in accordance with the requirements of a load. The apparatus includes a thermoelectric generator that generates electric power when subjected to a temperature differential, at least one configurable component that affects at least one aspect of the power generated by the thermoelectric generator, a monitor that senses at least one aspect of the power generated by the thermoelectric generator and provides at least one signal characterizing the power generated by the thermoelectric generator, and a controller. The controller is configured to receive the at least one signal and configure the at least one configurable component based on the at least one signal in accordance with the requirements of a load to which power is supplied by the thermoelectric generator. The configurable component may be a matrix switch that can reconfigure the interconnections between banks included in the thermoelectric generator.

22 Claims, 9 Drawing Sheets

AUTOMATIC CONFIGURATION OF THERMOELECTRIC GENERATION SYSTEM TO LOAD REQUIREMENTS

This application claims priority to provisional application 61/060,377, filed Jun. 10, 2008 and titled "Combined Heat and Power and Hydrogen Generation for Whole Home or Building with Ground Heat Exchanger Using Thermoelectric Seebeck Modules," the entire disclosure of which is hereby incorporated by reference herein for all purposes.

CROSS REFERENCE TO RELATED APPLICATIONS

This application is related to U.S. non-provisional application Ser. No. 12/481,741, U.S. non-provisional application Ser. No. 12/481,741, both having the same inventor as the present application and filed on Jun. 10, 2009. The disclosures of those two applications are hereby incorporated herein in their entirety for all purposes.

BACKGROUND OF THE INVENTION

A thermoelectric module is a device that exploits the thermoelectric effect exhibited by many materials. FIG. 1 shows a schematic diagram of the operation of a thermoelectric module 100. A thermoelectric module such as module 100 has the property that when current is passed through the module, for example at terminals 101, one side 102 of the module is cooled and the other side 103 is heated. Thermoelectric modules are used in this way in certain consumer devices such as water coolers and the like.

The thermoelectric effect is reversible, such that when the two sides of a thermoelectric module are held at different temperatures, the module can generate electric power. For example, in FIG. 1, rather than driving a current through terminals 101 to heat and cool module sides 102 and 103, the module sides 102 and 103 may be held in a temperature differential, and a voltage will be produced across terminals 101. When used to generate power, a thermoelectric module may be called a thermoelectric generator (TEG). The voltage produced and the amount of power available from the module depend on the temperature differential between the two sides 102 and 103, the materials used to construct the module, the absolute temperature at which the module is operated, the size of the module, and other factors.

This variability of available power makes it difficult to use thermoelectric generation to exploit temperature differentials or gradients that are variable, especially to supply power to a load that has specific requirements for the character of the power it receives.

BRIEF SUMMARY OF THE INVENTION

In one embodiment, an apparatus for automatically configuring a thermoelectric power generation system in accordance with the requirements of a load includes a thermoelectric generator that generates electric power when subjected to a temperature differential, and at least one configurable component that affects at least one aspect of the power generated by the thermoelectric generator. A monitor senses at least one aspect of the power generated by the thermoelectric generator and provides at least one signal characterizing the power generated by the thermoelectric generator. A controller is configured to receive the at least one signal and configure the at least one configurable component based on the at least one signal in accordance with the requirements of a load to which power is supplied by the thermoelectric generator. The controller may include a microprocessor and a memory holding instructions executable by the microprocessor to receive the at least one signal and configure the at least one configurable component based on the at least one signal in accordance with the requirements of a load to which power is supplied by the thermoelectric generator.

The temperature differential may be provided by a supply of heated fluid and a relatively cold sink, and the at least one configurable component may include a valve that, under control of the controller, adjusts a flow rate of the heated fluid. The temperature differential may be provided by a supply of heated fluid and a relatively cold sink, and the at least one configurable component may include a valve that, under control of the controller, adjusts the temperature of the heated fluid. The temperature differential may be provided by a relatively hot source and a supply of relatively cold fluid, and the at least one configurable component may include a valve that, under control of the controller, adjusts a flow rate of the relatively cold fluid. The temperature differential may be provided by a relatively hot source and a supply of relatively cold fluid, and the at least one configurable component may include a valve that, under control of the controller, adjusts the temperature of the relatively cold fluid.

The temperature differential may be provided by a supply of fluid heated by a solar collector, and the at least one configurable component may include a solar collector adjusting mechanism that adjusts the ability of the solar collector to impart heat to the heated fluid. The solar collector may be a flat panel solar collector, and the solar collector adjusting mechanism may adjust the position of a shade over the flat panel solar collector. The solar collector may be a concentrating solar collector, and the solar collector adjusting mechanism may adjust the aiming or focus of the concentrating solar collector.

The controller may be further configured to produce a second signal indicating a status of power being generated by the thermoelectric generator. The second signal may indicate the amount of power the thermoelectric generator is producing. The second signal may indicate that the thermoelectric generator is unable to produce power in accordance with the requirements of the load.

The thermoelectric generator may comprise at least two banks, each bank including at least one thermoelectric module, each bank producing a portion of the power produced by the thermoelectric generator. The at least one configurable component may include a matrix switch that, under control of the controller, configures the interconnection of the banks. Configuring the interconnection of the banks may include disconnecting at least one bank. Configuring the interconnection of the banks may include placing at least one bank in series with at least one other bank. Configuring the interconnection of the banks may include placing at least one bank in parallel with at least one other bank. Configuring the interconnection of the banks may include placing banks in a combination of series and parallel connections. Configuring the interconnection of the banks may include configuring the interconnection of the banks to maintain a desired output voltage for the thermoelectric generator.

Each bank may include at least two thermoelectric modules, each thermoelectric module producing a portion of the power produced by its respective bank. The at least one configurable component may include a matrix switch that, under control of the controller, configures the interconnection of the modules within a bank. In some embodiments, the thermoelectric generator comprises at least two banks, wherein each bank produces a portion of the power produced by the thermoelectric generator; each bank comprises at least two thermoelectric modules, wherein each thermoelectric module produces a portion of the power produced by its respective bank; each bank comprises a module-level matrix switch that, under control of the controller, configures the interconnection of modules within its respective bank; and the apparatus further comprises a bank-level matrix switch that, under control of the controller, configures the interconnection of the banks.

In another embodiment, a method of automatically configuring a thermoelectric power generation system in accordance with the requirements of a load comprises receiving, by a controller, at least one signal characterizing the power generated by a thermoelectric generator that generates electric power when subjected to a temperature differential, and receiving, by the controller, an indication of requirements of a load to which power is supplied by the thermoelectric generator. The method further comprises configuring, by the controller based on the at least one signal characterizing the power generated by the thermoelectric generator and based on the indication of the requirements of the load to which power is supplied by the thermoelectric generator, at least one configurable component that affects at least one aspect of the power generated by the thermoelectric generator.

The temperature differential may be provided by a heated fluid and a relatively cold sink, and configuring the at least one configurable component may include adjusting a valve that adjusts a rate of flow of the heated fluid. The temperature differential may be provided by a heated fluid and a relatively cold sink, and configuring the at least one configurable component further may include adjusting a valve that adjusts the temperature of the heated fluid. The temperature differential may be provided by a supply of heated fluid and a relatively cold sink, wherein the supply of heated fluid is heated by a solar collector, and configuring the at least one configurable component may include adjusting the ability of the solar collector to impart heat to the heated fluid.

The thermoelectric generator may include at least two banks, each bank comprising at least one thermoelectric module, each bank producing a portion of the power produced by the thermoelectric generator, and configuring the at least one configurable component may further include controlling a matrix switch to configure the interconnection of the banks. The thermoelectric generator may include at least two thermoelectric modules, each module producing a portion of the power produced by the thermoelectric generator, and configuring the at least one configurable component may further comprise controlling a matrix switch to configure the interconnection of the thermoelectric modules. The thermoelectric generator may include at least two banks, each bank comprising at least two thermoelectric modules, wherein each bank produces a portion of the power produced by the thermoelectric generator, wherein each thermoelectric module produces a portion of the power produced by its respective bank, and configuring the at least one configurable component may further comprise controlling a module-level matrix switch to configure the interconnection of at least two of the thermoelectric modules, and controlling a bank-level matrix switch to configure the interconnection of the banks.

In another embodiment, a method of converting thermal energy stored in a reservoir of heated fluid to electrical energy includes passing heated fluid from the reservoir to a hot side of a thermoelectric generator and cooling a cold side of the thermoelectric generator. The thermoelectric generator includes a plurality of thermoelectric modules. The method further includes monitoring an output voltage produced by the thermoelectric generator, and reconfiguring interconnections of the thermoelectric modules to maintain the output voltage within a desired range as the temperature of the heated fluid fluctuates.

The method may also include heating the heated fluid using a solar collector. The plurality of thermoelectric modules may be grouped into banks, and reconfiguring interconnections of the thermoelectric modules to maintain the output voltage within a desired range may include reconfiguring interconnections of the banks.

In another embodiment, a system for maintaining a power characteristic within a predetermined range include a monitor that measures a characteristic of power being supplied to a load by a thermoelectric generator, and a controller that receives a signal from the monitor. The signal communicates the measurement of the power characteristic, and the controller also includes a specification of a predetermined desired range for the power characteristic. The system also includes a matrix switch having a plurality of input connections, the input terminals receiving connections from a plurality of thermoelectric modules within the thermoelectric generator, and the matrix switch further comprising a set of output terminals through which power generated by the thermoelectric generator is delivered to the load. The controller is configured to compare the measurement of the power characteristic with the predetermined range, and to reconfigure interconnections between the input terminals and the output terminals to keep the power characteristic within the predetermined range. The predetermined characteristic may be a voltage. The controller further may include a microprocessor executing instructions stored on a computer-readable medium.

DETAILED DESCRIPTION OF THE INVENTION

Figure 1:
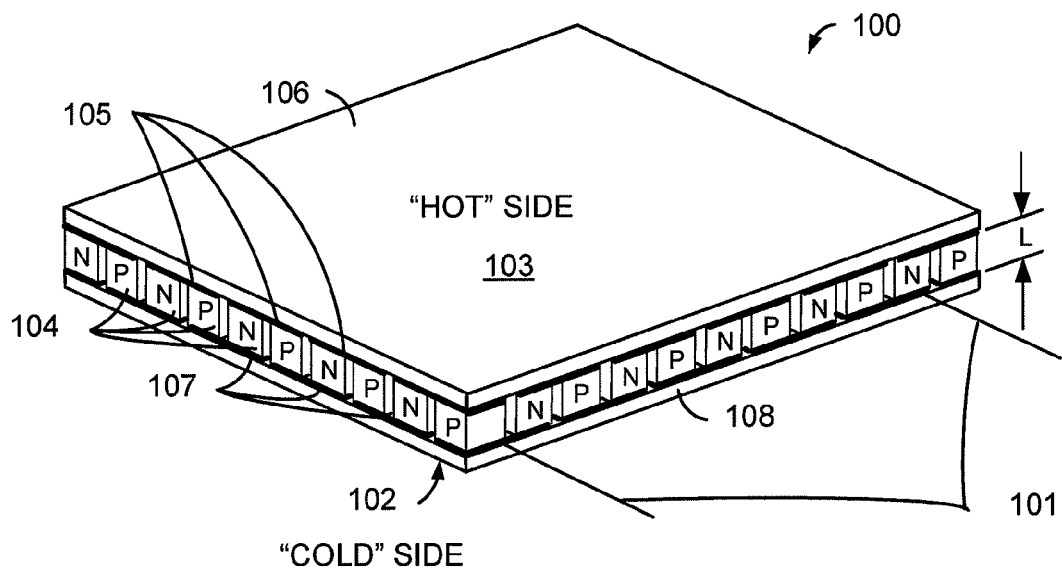
FIG. 1 shows a schematic diagram of the operation of a thermoelectric module.

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It being understood that various changes may be made in the function and arrangement of elements without departing from the spirit and scope as set forth in the appended claims.

Specific details are given in the following description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

The term "machine-readable medium" includes, but is not limited to portable or fixed storage devices, optical storage devices, wireless channels and various other mediums capable of storing, containing or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Thermoelectric module 100 is but one example of a thermoelectric device usable by embodiments of the invention. Module 100 is made up of a number of thermoelectric elements 104, each of which is a length of conductive or semiconductive material with favorable thermoelectric properties. For example, the elements may be pieces of n-type and p-type semiconductor material, labeled "N" and "P" in FIG. 1. The thermoelectric elements 104 are arranged in thermoelectric couples, each thermoelectric couple including one "N" element and one "P" element. The ends of the elements in each thermoelectric couple are electrically connected at hot side 103 of module 100 by one of conductors 105, and are further thermally connected to a heat source through an optional header 106. The various thermoelectric couples are connected in series at cold side 102 of module 100, by conductors 107, and are also thermally connected to a "cold" source or header 108 at the cold side 103 of module 100. Each thermoelectric couple generates a relatively small voltage, and the voltage appearing at leads 101 is the accumulated voltage of the series-connected thermoelectric couples. While many thermoelectric modules are made using n-type and p-type semiconductor materials for the thermoelectric elements 104, it will be understood that the invention is not so limited. Many other kinds of materials known and yet to be developed exhibit the thermoelectric effect, and may be used in embodiments. Similarly, other arrangements of the elements may be envisioned.

Preferably, thermoelectric modules used in embodiments of the invention are optimized for power generation. Research has shown that the total power available is maximized when the length "L" of the thermoelectric elements is quite short—for example about 0.5 millimeters. However, the conversion efficiency of a thermoelectric module (the fraction of available thermal energy actually converted to electrical energy) increases with increasing length L. For example, a thermoelectric element with a length of 5.0 millimeters may be several times more efficient than one with a length of 0.5 millimeters. The optimum length for a particular application (providing the minimum cost per expected unit of electrical energy) will be a function of the cost of the thermoelectric modules and associated hardware, the cost of the thermal energy supplied to the thermoelectric generator, and the expected life of the thermoelectric generator. A more complete discussion of the factors involved in optimizing the performance of a thermoelectric module may be found in D. M. Rowe and Gao Min, *Evaluation of thermoelectric modules for power generation*, Journal of Power Sources 73 (1998)193-198.

Figure 2:
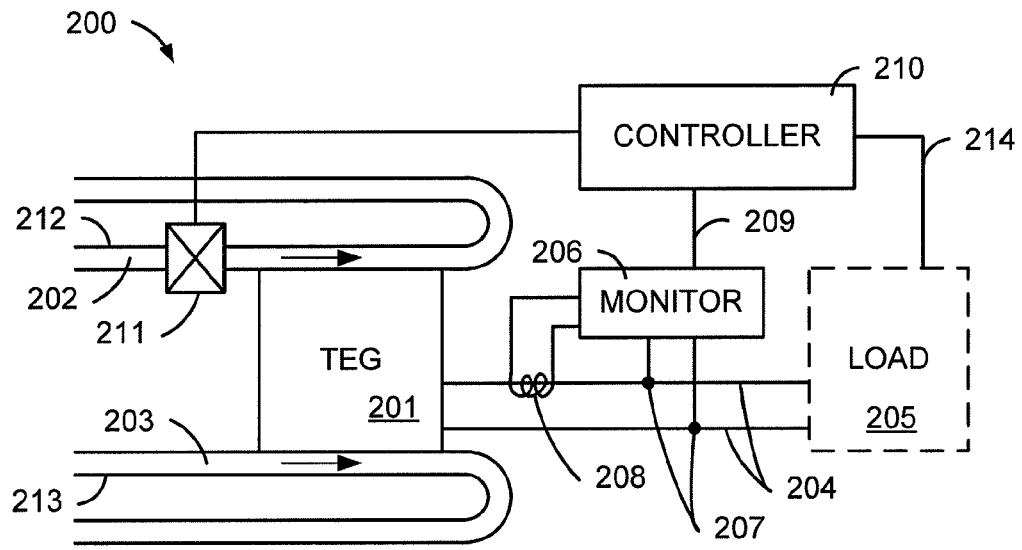
FIG. 2 illustrates a system in accordance with an embodiment of the invention.

FIG. 2 illustrates a system 200 in accordance with an embodiment of the invention. A thermoelectric generator (TEG) 201 generates electric power when it is subjected to a temperature differential. In FIG. 2, the temperature differential is provided by a heated fluid 202 and a relatively cold fluid 203 piped to opposite sides of TEG 201. For the purposes of this disclosure, a thermoelectric generator is a device that produces electric power when subjected to a temperature differential. A thermoelectric generator may, but need not, include many thermoelectric modules such as thermoelectric module 100, which may in turn include many thermoelectric elements arranged in thermoelectric couples.

It is to be understood that a temperature differential may be provided by any of many, many different media and apparatus. For example, heated fluid 202 may be produced specifically for the purpose of generating electricity, for example by heating water using conventional fossil fuels, solar energy, or by some other means. Alternatively, heated fluid 202 may be the by-product of an industrial process, waste water from an establishment such as a car wash or laundry, naturally occurring hot spring water, or another kind of fluid.

The "hot" side of a temperature differential may be provided by another medium besides a fluid, for example, air exhausted from a building air conditioning system, exhaust gasses from an engine, the surface of any component such as a vehicle exhaust pipe, oven exterior, blast furnace environment, or other suitable heat source.

Similarly, relatively cold fluid 203 may be obtained specifically for the purpose of power generation, or may be the by-product of some other process. For example, cold fluid 203 may be water that is circulated through an underground pipe to cool the water to the temperature of the ground—typically about 54-57° F. (12-14° C.) in many parts of the United States. Or fluid 203 may be any naturally-occurring relatively cold fluid, for example water diverted from a river or stream. The "cold" side of a temperature differential may be provided by media and materials other than fluids, for example ambient air, a metallic object, or some other suitable "cold" source.

Nearly any temperature differential may be exploited for power generation, and the terms "hot", "heated", "cold", and the like are to be understood to be relative terms. For example, both the "hot" and "cold" sides of a temperature differential may be perceived as hot to human senses, but the differential may still be exploited by a TEG. Similarly, both the "hot" and "cold" sides of a temperature differential may be considered cold by human senses.

Returning to FIG. 2, TEG 201 produces electric power, which is output on leads 204 and supplied, directly or indirectly to a load 205. Load 205 is shown in dashed lines in FIG. 2 to emphasize that it is not considered to be part of the invention, unless specifically claimed. Load 205 may have specific requirements for the power it receives in order to operate properly. For example, load 205 may include an inverter configured to supply alternating current to an area, and the inverter may operate properly only when supplied with a DC voltage between 36 and 48 volts. Or the load may comprise a microprocessor-based system that requires a minimum amount of power for error-free operation.

A monitor 206 senses at least one aspect of the power generated by TEG 201. For example, probe leads 207 may tap into leads 204 to enable monitor 206 to measure the voltage being output by TEG 201. A current probe 208 may enable monitor 206 to measure the current being output by TEG 201. Other measurements are possible, and other aspects of the power may be measured or derived. For example, monitor 206 may multiply the output voltage and current to measure the amount of power being provided by TEG 201.

Monitor 206 provides at least one signal 209 that characterizes the power being generated by TEG 201. While the signal is represented in FIG. 2 as a line, it is to be understood that the signal may be an analog signal, a digital signal, a numerical value carried in either analog or digital form, or another kind of signal.

Signal 209 is supplied to a controller 210. Controller 210 is preferably a microprocessor-based device including a processor, memory, and input/output capabilities, but may be another kind of controller as well. Controller 210 is supplied with a description of the power requirements of load 205. For example, an indication of the requirements may be stored in a memory comprised in controller 210. Controller 210 preferably includes program instructions stored in memory or another kind of machine readable medium. The program instructions, when executed by the processor, enable the controller to carry out its functions. Controller 210 is configured to receive signal 209 and configure at least one configurable component based on signal 209 in accordance with the requirements of load 205. For example, controller 210 may recognize the voltage being produced by TEG 201 is above or below the optimum for load 205, and may take action to adjust the voltage by configuring another component in the system.

One example of a configurable component is valve 211 shown in FIG. 2. In this example, valve 211 is placed in a flow line 212 carrying heated fluid 202 to the "hot" side of TEG 201. Valve 211 is controllable by controller 210.

In one example scenario, controller 210 may recognize that the voltage being supplied by TEG 201 is above or nearly above the maximum voltage that load 205 can accept, and may instruct valve to close, thereby reducing the flow of heated fluid to TEG 201. Many other control scenarios are possible. For example, controller 210 may recognize that the voltage being produced by TEG 201 is below or nearly below the minimum voltage required by load 205, and may cause valve 211 to open, thereby increasing the flow of heated fluid to TEG 201. Similarly, a valve could be inserted into flow line 213 carrying relatively cold fluid to the "cold" side of TEG 201, and controller 210 may regulate the flow of the relatively cold fluid in accordance with signal 209 and the requirements of load 205. In another scenario, controller 210 may recognize that load 205 is shut off and not drawing any current, and controller 210 may then control valve 211 to completely shut off the flow of heated fluid so as to not deplete a reservoir of heated fluid.

In some embodiments, controller 210 produces a second, output signal 214 that indicates a status of the power being generated by TEG 201. While second signal 214 is shown in FIG. 2 as being directed to load 205, second signal 214 may be directed to any other suitable location. Second signal 214 may indicate, for example, the amount of power being generated by TEG 201, or may be an indication that the system is no longer able to produce power in accordance with the requirements of load 205. Second signal 214 may be an analog signal, a digital signal, a wireless signal, may be transmitted over a wire or cable, may be presented on a display, or may be communicated in any other suitable manner.

Figure 3:
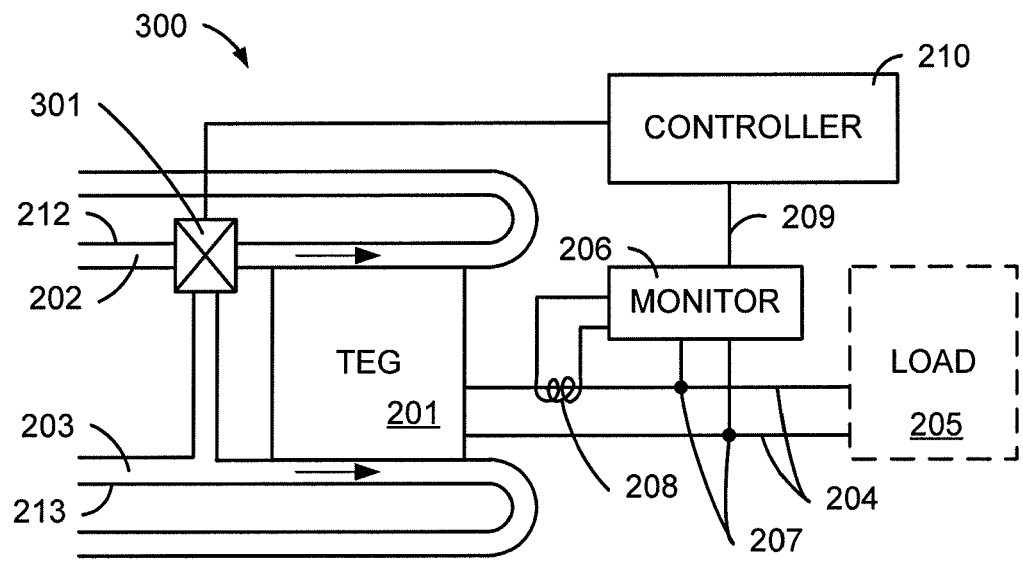
FIG. 3 illustrates a system in accordance with another embodiment.

In another scenario, controller 210 may regulate the temperature of either heated fluid 202, or relatively cold fluid 203, or both. FIG. 3 illustrates a system 300, an embodiment in which controller 210 regulates the temperature of heated fluid 202 using a mixing valve 301 that variably mixes cold fluid into heated fluid 202 to control the temperature of heated fluid 202. For example, if controller 210 recognizes that the voltage being output by TEG 201 exceeds or nearly exceeds the voltage requirement of load 205, controller 210 may adjust valve 301 to cause the temperature of heated fluid 202 to be reduced, in order to reduce the temperature differential experienced by TEG 201, thereby reducing the voltage produced by TEG 201. Similarly, if controller 210 recognizes that the voltage being produced by TEG 201 is below or nearly below the minimum required by load 205, controller 210 may reduce the amount of cold fluid mixed with heated fluid 202 by valve 301 or may stop all mixing in order to increase the temperature differential experienced by TEG 201, thereby increasing the voltage produced by TEG 201. One of skill in the art will recognize that warm fluid could also be mixed into relatively cold fluid 203, and adjusted to adjust the voltage produced by TEG 201.

Many other kinds of configurable components are possible. For example, if air is used to provide a temperature differential to TEG 201, a configurable component may include a fan that cools the "cold" side of TEG 201, and the fan may be turned on or off, or adjusted in speed by controller 210. A configurable component may adjust the media at the "hot" side of TEG 210, or the "cold" side of TEG 201, or both.

Figure 4:
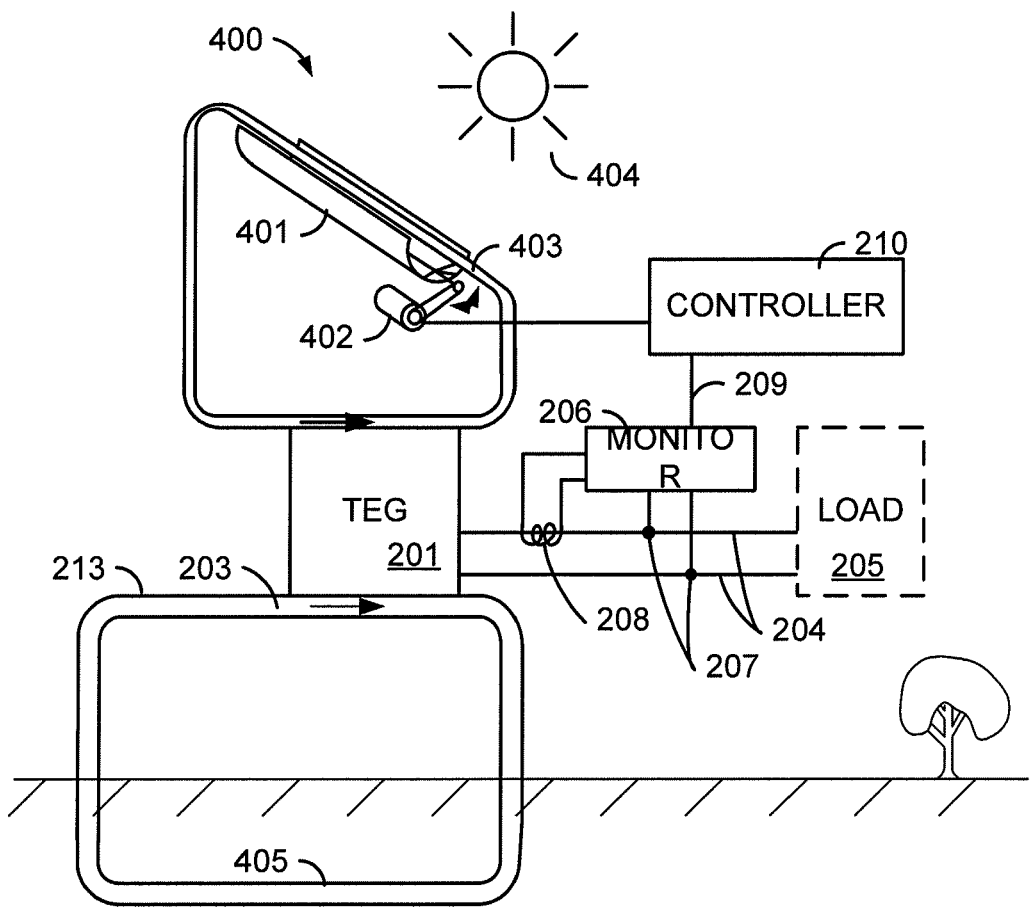
FIG. 4 illustrates an embodiment of a configurable component.

FIG. 4 illustrates a system 400 including another kind of configurable component. In the system of FIG. 4, heated fluid 202 is supplied from a concentrating solar collector 401, which is rotated by motor 402. For example, solar collector 401 may have a parabolic shape that focuses incoming solar radiation on tube 403 when collector 401 is properly aimed at the sun 404. Fluid from tube 403 may be circulated to TEG 201, providing the "hot" side of the temperature differential exploited by TEG 201 to generate electric power. In this embodiment, the configurable component adjusted by controller 210 may be the rotational angle of collector 401, as controlled by motor 402. For example, if controller 210 recognizes that the voltage being produced by TEG 201 is above or nearly above the maximum voltage acceptable to load 205, controller 210 may send a signal to motor 402 to defocus or adjust the aiming of collector 401 so that collector 401 no longer points directly at the sun 404. In that case, less heat will be supplied to heated fluid 202, reducing the temperature differential experienced by TEG 201, and reducing the voltage produced by TEG 201. Conversely, when controller 210 recognizes that the voltage produced by TEG 201 is below or nearly below the minimum required by load 205, and that collector 401 is not aimed at the sun 404, controller 210 may control motor 402 to once again aim collector 410 at the sun, increasing the amount of heat supplied to fluid 202, increasing the temperature differential experienced by TEG 201, and increasing the voltage produced by TEG 201. The position of the sun 404 may be tracked by sensors not shown in FIG. 4 for simplicity of illustration. One of skill in the art will recognize that motor 402 may be any suitable kind of motor, including a stepper motor, a DC servo motor, and AC servo motor, or other kind of motor. Control electronics for driving motor 402 are omitted from FIG. 4 for clarity.

FIG. 4 also shows one particular embodiment for providing relatively cold fluid 403 to TEG 201. In FIG. 4, tube 413 connects with an underground loop 405. As is well known, the temperature of the ground at sufficiently deep levels remains relatively constant throughout the year. In some parts of the United States, for example, the underground temperature may be about 54-57° F. (12-14° C.). Water may be circulated by a pump (not shown) through loop 405 after absorbing heat from the "cold" side of TEG 201, thereby cooling the water by transferring its absorbed heat to the ground. This way, the "cold" side of TEG may be maintained at a sufficiently cold temperature at little cost. While loop 405 is shown as a single straight section in FIG. 4, many other configurations are possible. For example, loop 405 may be in a substantially vertical orientation in a relatively deep well, or loop 405 may include a series of coils placed in a trench.

One of skill in the art will recognize that other kinds of adjustments may be made to a system that uses solar energy to heat the heated fluid provided to TEG 201. For example, rather than a concentrating collector, a flat panel solar collector could be used, and controller 210 may control a shade that can be moved to block solar radiation from reaching the flat panel collector, or to allow solar radiation to reach the collector.

Figure 5:
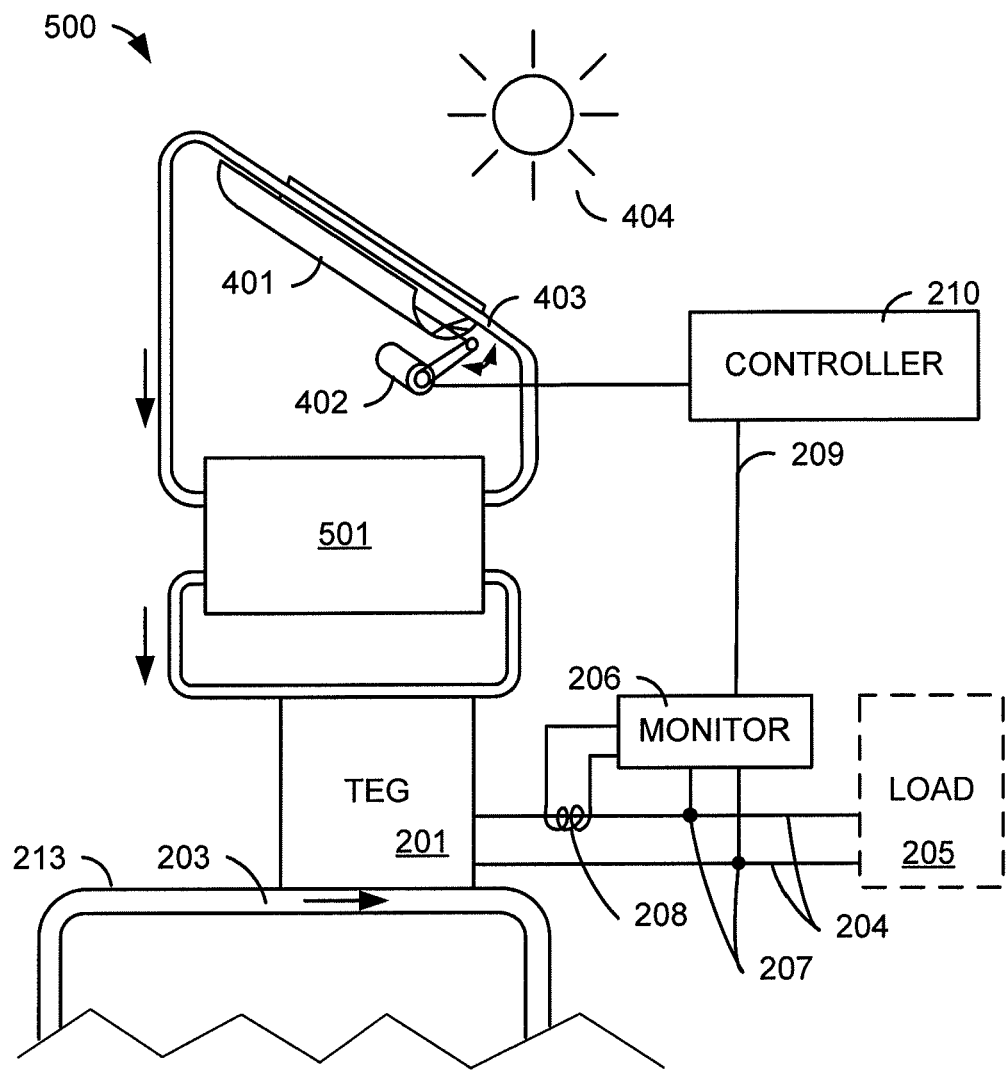
FIG. 5 illustrates an embodiment that uses solar energy for heating a fluid supplied to a thermoelectric generator.

FIG. 5 illustrates another embodiment that uses solar energy for heating a fluid supplied to TEG 201. This embodiment is similar to the embodiment shown in FIG. 4, but includes a storage tank 501, for example for holding water. Fluid circulating through collector 401 heats the water or other fluid in tank 501, which is then circulated to TEG 201 to provide the "hot" side of the temperature differential for TEG 201. The fluids used by collector 401 and TEG 201 may be but need not be the same. For example, a high-temperature-tolerant oil may be circulated through collector 401, imparting its heat to water in tank 501 using a heat exchanger. Similarly, tank 501 may use another fluid besides water. Many combinations are possible.

The embodiment of FIG. 5 has the valuable advantage for storing heat that can be used for later generation of electric power by TEG 201. For example, water in tank 501 may be heated during the day, and the heated water may be circulated to TEG to generate electric power at night. Preferably, tank 501 is insulated, so that it will retain heat for extended periods.

While the control embodiments described above have included configurable components that adjust the temperature differential or amount of thermal energy available to a TEG, other kinds of configurable components may be used. In place of or in addition to adjustments made to the temperature differential or thermal energy supplied to the TEG, the output of the TEG may also be configured using electrical techniques and components. Control on the electrical side of the system may be especially advantageous in conjunction with a system that includes hot liquid storage, such as system 500.

Figure 6:
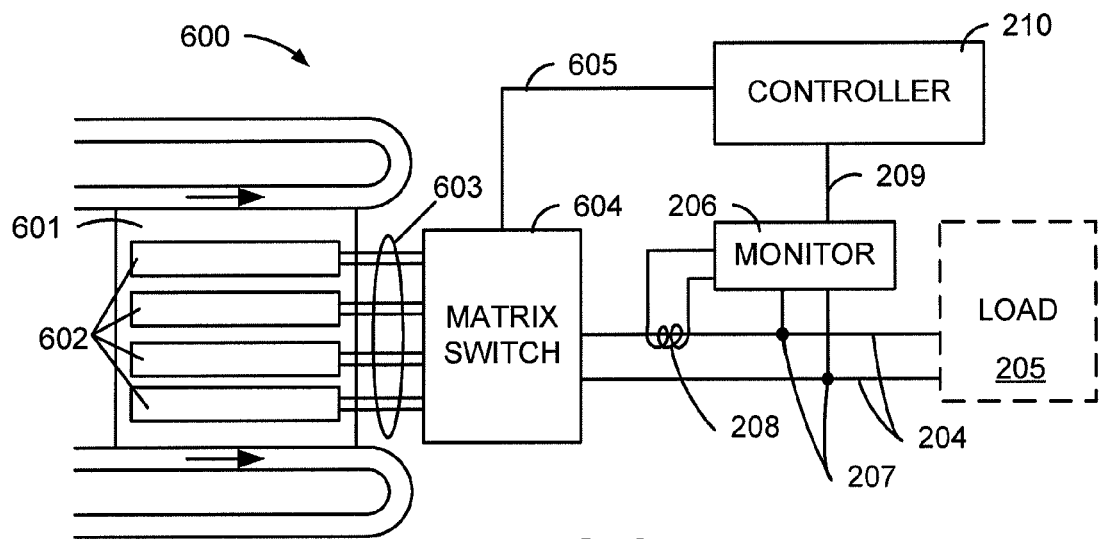
FIG. 6 illustrates an embodiment in which the output of a thermoelectric generator is adjusted electrically.

FIG. 6 illustrates another embodiment 600, in which the output of a TEG 601 is adjusted electrically. While TEG 201 shown in FIG. 2 was represented as a monolithic block, TEG 601 shows additional internal structure. TEG 601 is made up of multiple banks 602. Each bank 602 includes at least one thermoelectric module, and generates at least a portion of the power generated by TEG 601. While banks 602 are shown as stacked together in FIG. 6, this is not a requirement. Preferably, each bank 602, and even each module within each bank 602, is exposed to the full temperature differential experienced by TEG 601. Internal piping or other routing of fluids is omitted from FIG. 6 for clarity.

The leads 603 from modules 602 are individually routed to a matrix switch 604, which will be described in more detail below. While matrix switch 604 is shown in FIG. 6 as separate from TEG 601, the two components may be integrated into a single unit. Matrix switch 604 is controllable by controller 210, and can dynamically reconfigure the interconnections of modules 604 to adjust the character of the power being delivered by TEG 601. It is to be understood that control signal 605 shown passing from controller 201 to matrix switch 604 may in fact comprise several separate signals, including addressing lines and command lines. Alternatively, control signal 605 maybe a message transmitted to matrix switch 604, which may have its own internal intelligence for interpreting the control signal and carrying out the necessary operations.

For example, each bank 602 may nominally produce power at 24 volts when subjected to a temperature differential of 50° C., and load 205 may require that power be supplied at a voltage between 30 and 50 volts. When the temperature differential is at or slightly below 50 degrees, an efficient interconnection of the banks would be to place pairs of banks in series, and then place the series sets in parallel, so that the voltage output from matrix switch 604 is approximately two times the voltage produced by an individual bank, or nominally 48 volts. This arrangement is shown schematically in FIG. 7. Alternatively, pairs of banks could be placed in parallel, and the sets placed in series, also resulting in a nominal 48 volts.

If the temperature differential declines, for example if the system operates in this configuration for an extended period when tank 501 is not being reheated, the voltage produced by each bank will decline from the nominal 24 volts, and the voltage supplied to load 205 will decline. When the voltage produced by each bank reaches 16 volts, the voltage supplied to the load will be only 32 volts (two times 16). If the voltage produced by each bank drops below 15 volts, the voltage to the load will drop below 30 volts—below the minimum requirement for load 205.

At this point, it would be advantageous to reconfigure the interconnections of the banks, for example to place two banks in parallel, and place that pair in series with the two other banks, so that the resulting output voltage is nominally three times that produced by each individual module. This configuration is shown schematically in FIG. 8. This configuration brings the output voltage back within a usable range. The total amount of power may decline as an unavoidable consequence of the decline in temperature differential.

Figure 9:
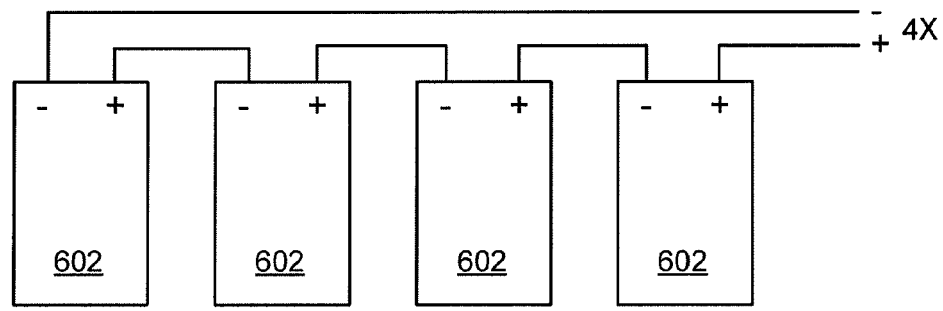
FIG. 9 illustrates another example interconnection of banks in a thermoelectric generator.

If the temperature differential drops further, for example to the point that each bank produces less than 10 volts, then even three times the voltage of an individual bank will be out of the range required by load 205. At this point, it would be advantageous to place all four banks in series, so that the output voltage is four times the voltage of an individual bank, or more precisely, the sum of the voltages produced by the four individual banks. For ease of explanation, it is assumed in most of this discussion that the banks perform identically to each other. This assumption is sufficiently accurate to explain the nominal operation of the system, but in practice, there may be variations in performance among the banks, so that the output voltage of the system may not be an exact integer multiple of the voltage of any one bank. It is to be understood that the claims encompass such real-world operation. The arrangement of all four banks in series is shown schematically in FIG. 9.

By proper configuration of the interconnection of the banks, it is possible to achieve an output voltage that is nominally any integer multiple of the voltage produced by an individual bank, up to the number of banks. With four banks as shown in FIG. 6, the voltage supplied to load 205 may be 1, 2, 3, or 4 times the voltage produced by an individual bank. If 12 banks are used, then the voltage supplied to the load could be nominally 1, 2, 3, 11, or 12 times the voltage produced by an individual bank. Using a larger number of banks allows finer control of the total output voltage, and enables control within a narrower range.

Figure 10:
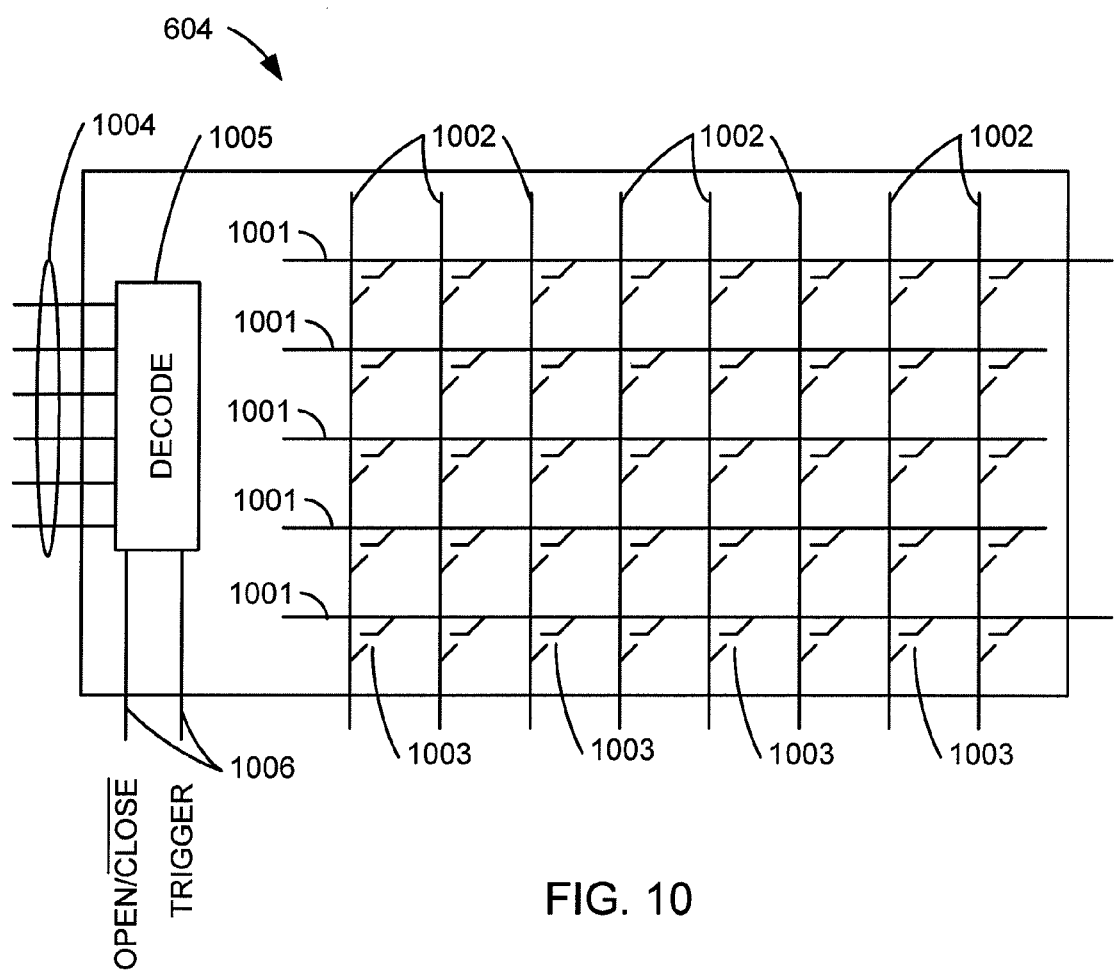
FIG. 10 illustrates the operation of a matrix switch.

The reconfiguration of the bank interconnections may be accomplished using matrix switch 604, under the control of controller 210. FIG. 10 shows a more detailed schematic diagram of matrix switch 604. In its general form, matrix switch 604 comprises two sets of conductors that may form a grid pattern. For ease of reference, these will be referred to as horizontal conductors 1001 and vertical conductors 1002, however these terms refer only to the representations in the Figures, and do not limit the invention to conductors in strictly horizontal and vertical orientations. The conductors need not form a uniform grid pattern. This kind of switch is also sometimes referred to as a "crossbar switch". Matrix switch 604 also comprises addressable switches 1003 (only a few of which are labeled) that can make or break connections between crossing pairs of conductors 1001, 1002. If every intersection in the matrix switch is provided with an addressable switch, then any horizontal conductor 1001 can be connected to any or all of vertical conductors 1002, and vice versa. The addressable switches may be any kind of suitable switch or relay, including electromechanical relays, solid state devices, or other kinds of switches. The addressable switches need not be all the same.

Addressable switches 1003 are operated using address lines 1004 and control lines 1006 from controller 210. The details of decoding logic 1005 and the component interconnections are not shown in FIG. 10, as one of skill in the art will recognize that many different arrangements are suitable, so long as controller 210 can close or open addressable switches 1003 to reconfigure the connections in matrix switch 604. Addressable switches 1003 may be individually addressable, so that controller 210 can change the state of any one switch without affecting the others, or addressable switches 1003 may be addressable in groups, such as in pairs or other combinations. In some embodiments, not all intersections between horizontal and vertical conductors may have associated addressable switches. In this example, matrix switch 604 has two vertical conductors 1002 for each bank, and five horizontal conductors 1001, which are sufficient to make the necessary connections for four banks 602. Six address lines 1004 enable individual selection of any one of the 40 switches 1003. Control lines 1006 provide an indication of whether the selected switch is to be opened or closed, and a strobe or trigger signal to cause the selected operation to occur. Controller 210 may be configured to perform the switch configurations in an order compatible with the characteristics of the banks 602, and the load requirements. For example, controller 210 may avoid shorting the terminals of any bank 602, and may perform switching operations in a "make before break" or "break before make" order, to avoid interruptions in the supply of power to load 205, to protect banks 602 from damage, or for other reasons. Banks 602 may be characterized before assembly of the system, and controller 210 may be configured to preferably select banks with similar characteristics for parallel connections.

Figure 7:
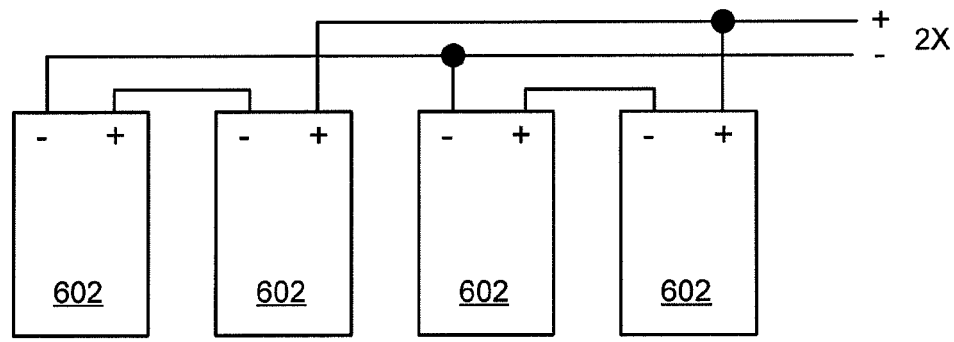
FIG. 7 illustrates an example interconnection of banks in a thermoelectric generator.
Figure 11:
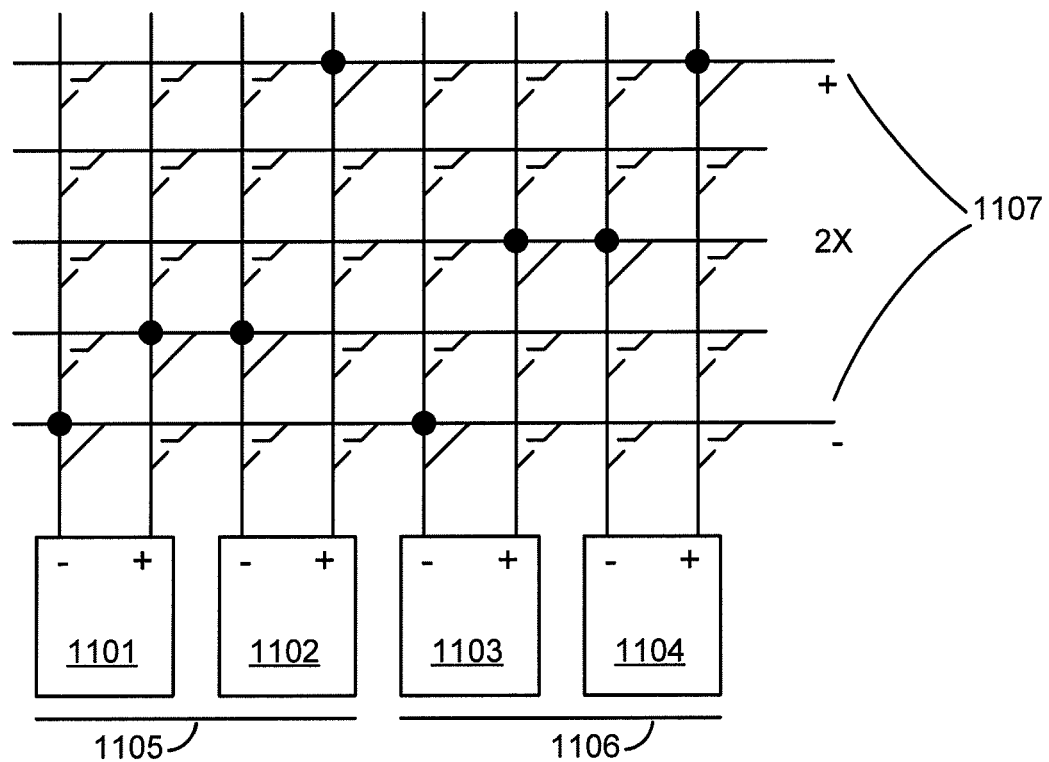
FIG. 11 shows the matrix switch of FIG. 10 configured to place banks in the arrangement shown schematically in FIG. 7.

FIG. 11 shows matrix switch 604 configured to place banks 602 in the arrangement shown schematically in FIG. 7. (The decoding logic of switch 604 is omitted for clarity.) That is, banks 1101 and 1102 are connected in series to form a set 1105, banks 1103 and 1104 are connected in series to form a second set 1106, and sets 1105 and 1106 are connected in parallel so that the output voltage across terminals 1107 is two times the voltage produced by a single bank.

Figure 8:
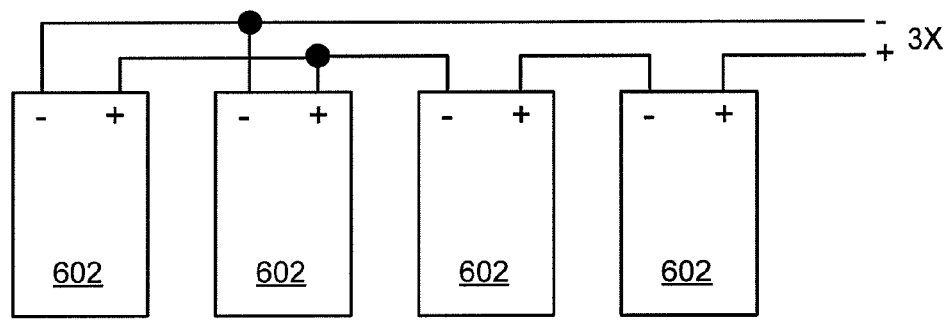
FIG. 8 illustrates another example interconnection of banks in a thermoelectric generator.
Figure 12:
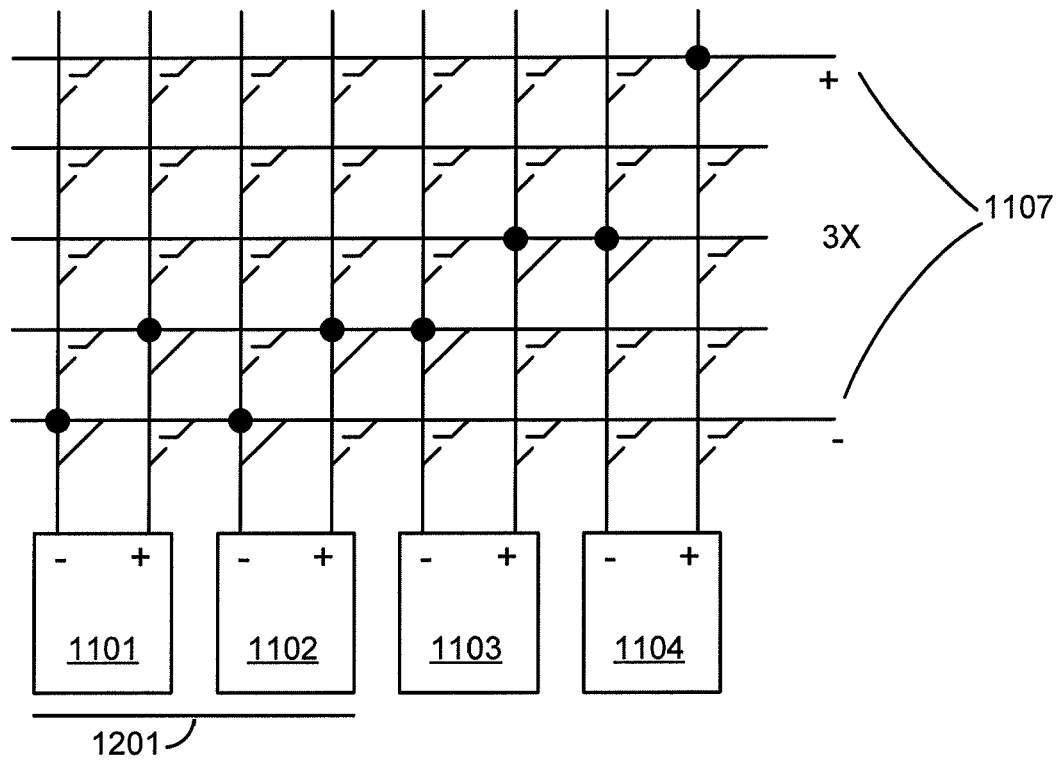
FIG. 12 shows the matrix switch of FIG. 10 configured to place banks in the arrangement shown schematically in FIG. 8.

FIG. 12 shows matrix switch 604 configured to place banks 602 in the arrangement shown schematically in FIG. 8. That is, banks 1101 and 1102 are connected in parallel to form a set 1201, which is then connected in series with banks 1103 and 1104 so that the output voltage across terminals 1107 is nominally three times the voltage produced by a single bank. In another possible configuration, any three of the banks could be connected in series, and the fourth bank left disconnected, so that the output voltage across terminals 1107 is nominally three times the voltage produced by a single bank.

Figure 13:
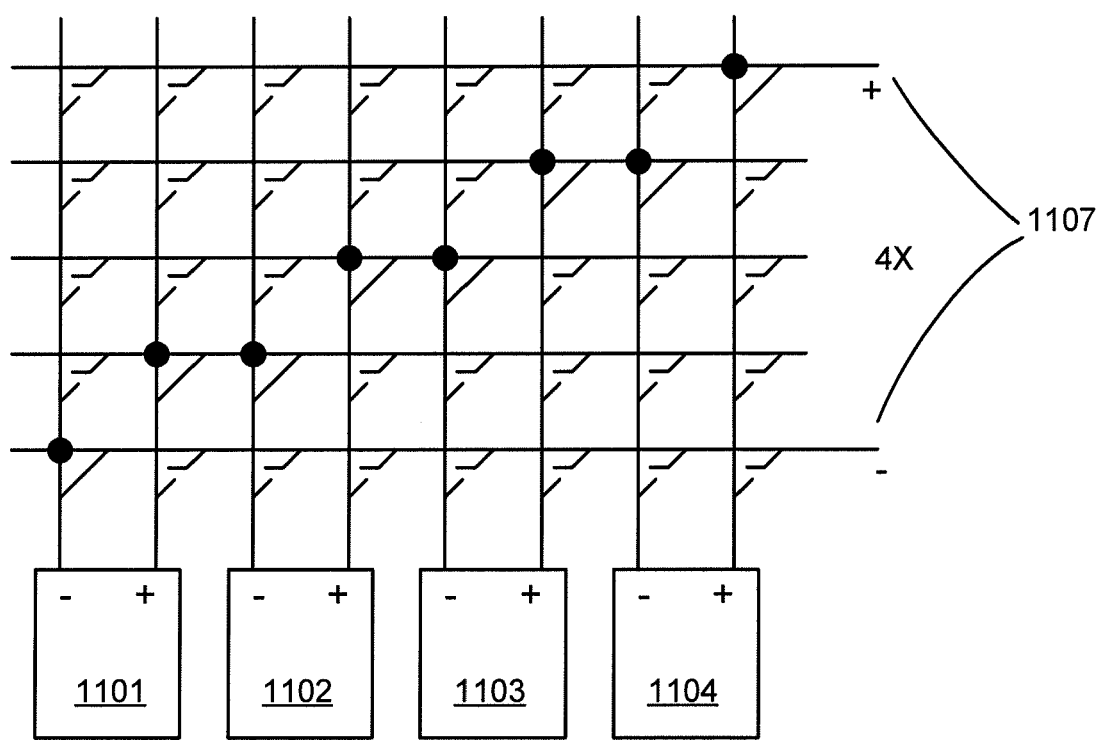
FIG. 13 shows the matrix switch of FIG. 10 configured to place banks in the arrangement shown schematically in FIG. 9.

FIG. 13 shows matrix switch 604 configured to place banks 1101, 1102, 1103, and 1104 all in series, so that the output voltage across terminals 1107 is nominally the sum of the voltages produced by the four banks, or four times the voltage produced by an individual bank.

In this way, the interconnections of the banks can be dynamically reconfigured to adjust the output voltage of TEG 601 to meet a requirement of load 205. Preferably, the reconfiguration is performed in a sequence that avoids possible damage to banks 602. For example, certain connections may be broken before others are made, such as to avoid connecting both terminals of a single bank together at any time. One of skill in the art will recognize that much larger matrix switches may be constructed, that can reconfigure much larger numbers of banks than the four shown in these examples. In this way, very large variations in the generating capacity of individual banks may be accommodated, while producing output power in accordance with the requirements of a load.

While matrix switch 604 is depicted for ease of explanation and conceptualization as being laid out in a rectangular matrix, and having a switch 1003 for every intersection between any horizontal conductor 1001 and vertical conductor 1002 (a total of 40 switches 1003), these are not requirements. In the example configurations shown in FIGS. 11-13, only 12 of the switches 1003 ever change state. Of the other 28 switches depicted, 25 are never closed and could be omitted, and three remain closed and could be replaced with permanent electrical connections. One of skill in the art will recognize that it is desirable to construct a system with the fewest components possible in order to minimize the cost of the system. It is to be also understood that matrix switch 604 need not be implemented as a single integrated device and need not physically resemble a matrix, but may comprise logic and switch components that are located together or separately in any suitable locations in the system.

The capability to reconfigure the interconnections between modules may be especially useful in a system with thermal storage, such as system 500 shown in FIG. 5. During extended periods without sun, the temperature of the fluid in tank 501 may decline until the temperature differential experienced by the TEG is only a few degrees. By reconfiguring the interconnection of modules in the TEG, usable power (in a declining amount) may be extracted over a very wide range of temperatures in tank 501, and nearly all of the stored thermal energy may be utilized. This is in contrast to electrical energy stored in batteries. While a battery may store considerable energy, some kinds of batteries cannot be fully discharged without compromising the life of the batteries, and therefore not all of their stored energy may be utilized reliably.

In other embodiments, one or more of banks 602 may be made up of multiple thermoelectric modules (TEMs). For example, each of banks 602 may comprise 12 TEMs, each nominally producing 2 volts. When all 12 TEMs are connected in series, a bank then produces 24 nominal volts. Each bank may further comprise a module-level matrix switch that enables reconfiguration of the interconnections of the modules within a bank. In this case, matrix switch 604 may be referred to as a "bank-level" matrix switch, as it reconfigures the interconnections of the banks with each other. In this example, with 12 modules in a bank, a bank may be configured to produce any multiple of the voltage produced by a module, up to 12 times the module voltage.

Figure 14:
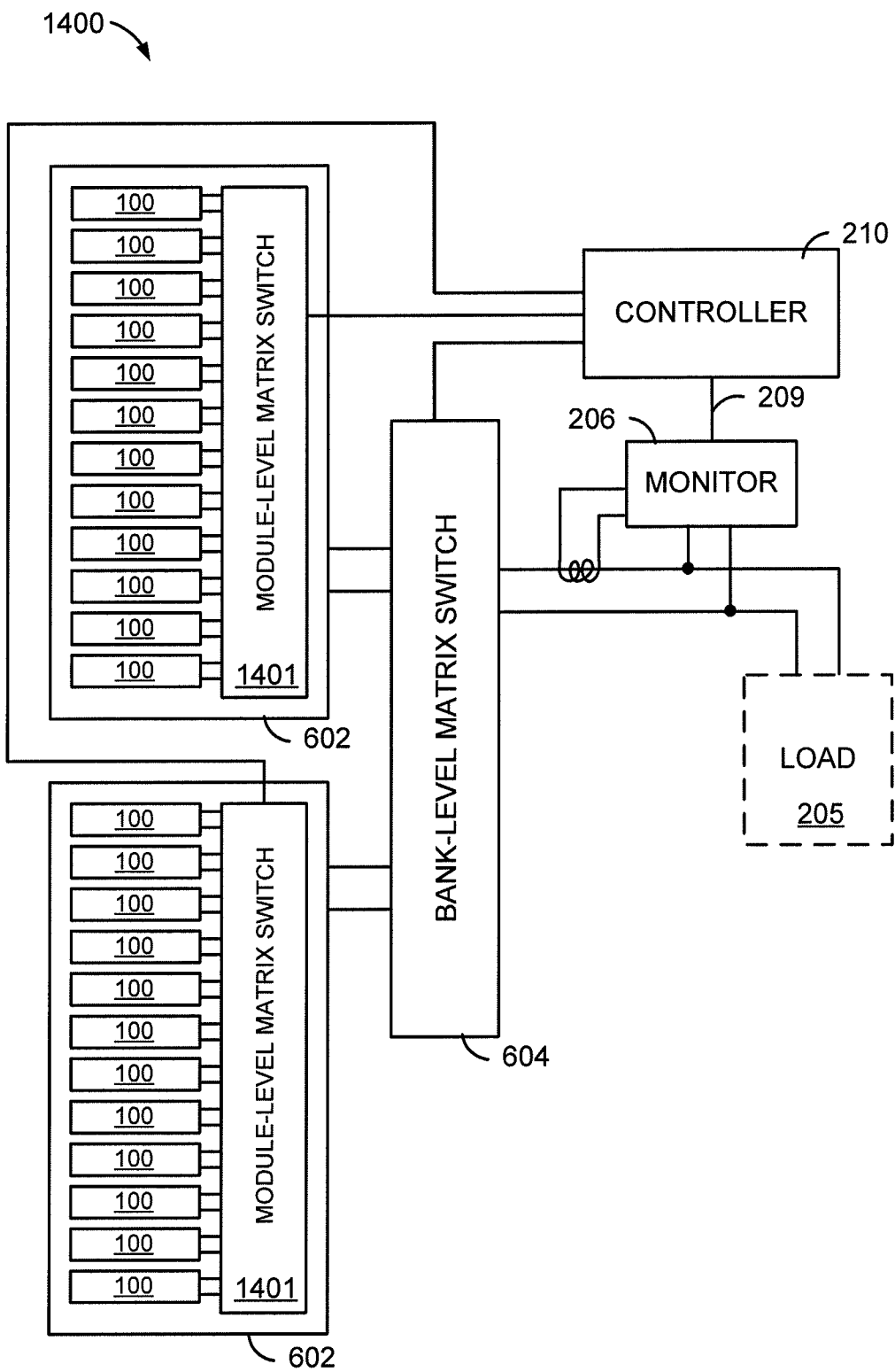
FIG. 14 illustrates a system in accordance with another embodiment, including both module-level matrix switches and a bank-level matrix switch.

FIG. 14 illustrates a system 1400 wherein each of two banks 602 includes 12 TEMs 100. Each bank includes a module-level matrix switch 1401, which, under the control of controller 210, reconfigures the interconnections of the TEMs 100 within its respective bank. Bank-level matrix switch 604 can reconfigure the interconnections of the banks 602. Module-level matrix switch 1401 may be constructed similarly to bank-level matrix switch 604, as is illustrated in FIG. 10. As before, monitor 206 may measure one or more characteristics of the power being generated by the system, and may provide a signal 209 to controller 210 characterizing the power being generated. Based on the power characteristics and the requirements of load 205, controller 210 may reconfigure the interconnections of the TEMs 100 within either or both banks 602, or may reconfigure the interconnections of banks 602, or may reconfigure connections of modules 100 and banks 602, in any combination. In an alternative embodiment, the system may monitor the character of power being generated by each bank individually, in addition to or instead of monitoring the power being delivered to load 205, and controller 210 may incorporate these different or additional measurements into its decision to reconfigure connections of TEMs 100, banks 602, or both.

Figure 15:
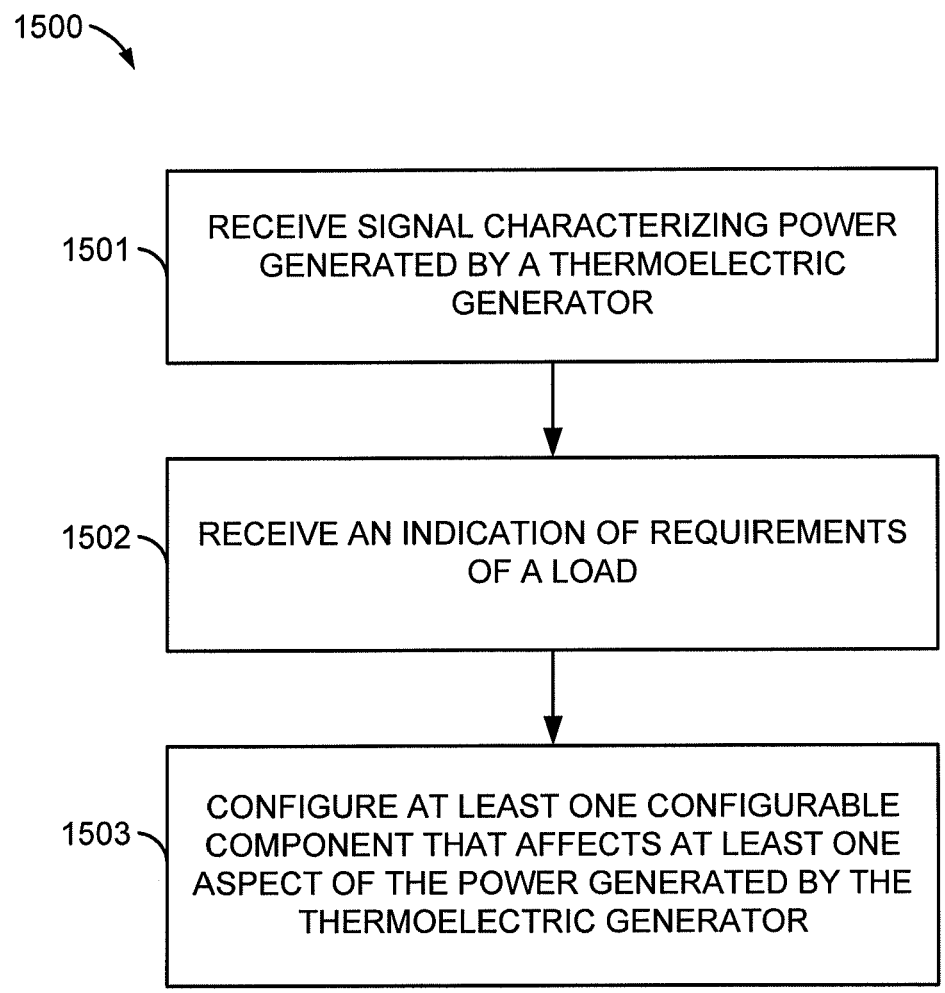
FIG. 15 illustrates a flowchart of a method in accordance with an embodiment of the invention.

FIG. 15 illustrates a flowchart 1500 of a method in accordance with an embodiment of the invention. In step 1501, a signal is received characterizing the power generated by a thermoelectric generator. In step 1502, an indication is received of the requirements of a load. In step 1503, at least one configurable component is configured, the configurable component affecting at least one aspect of the power generated by the thermoelectric generator.

The invention has now been described in detail for the purposes of clarity and understanding. However, it will be appreciated that certain changes and modifications may be practiced within the scope of the appended claims.

What is claimed is:

1. An apparatus for automatically configuring a thermoelectric power generation system in accordance with the requirements of a load, the apparatus comprising:
   a monitor that measures a characteristic of power being supplied to a load by a thermoelectric generator, wherein the thermoelectric generator generates electric power when subjected to a temperature differential, the thermoelectric generator including thermoelectric modules arranged in a plurality of banks, each bank comprising a plurality of thermoelectric modules;
   a controller that receives a signal from the monitor, the signal communicating the measurement of the power characteristic, the controller also including a specification of a predetermined desired range for the power characteristic;
   a bank-level matrix switch and a plurality of module-level matrix switches, wherein a module-level matrix switch exists for each bank of thermoelectric modules;
   wherein each matrix switch has a plurality of input terminals, the plurality of input terminals of the module-level matrix switch electrically connected to the thermoelectric modules within a bank, thereby creating electrical interconnections between the thermoelectric modules within a bank, and wherein the plurality of the input terminals of the bank-level matrix switch are electrically connected to the plurality of banks, thereby creating electrical interconnections between the banks;
   wherein each of the module-level matrix switches comprises an output terminal for routing power to the bank-level matrix switch, wherein the bank-level matrix switch comprises an output terminal for routing power to the load;
   wherein each of the module-level matrix switches has the capability, as a configurable component under control of the controller, to configure the electrical interconnection of the thermoelectric modules in a respective bank of thermoelectric modules,
   wherein the bank-level matrix switch has the capability, as a configurable component under control of the controller, to configure the electrical interconnection of the banks,
   wherein the controller is configured to automatically compare the measurement of the power characteristic with the predetermined range and to cause the module-level matrix switches and the bank-level matrix switch to dynamically reconfigure the electrical interconnections to keep the power characteristic within the predetermined range.

2. The apparatus for automatically configuring a thermoelectric power generation system in accordance with the requirements of a load as recited in claim 1, wherein the controller comprises: a microprocessor; and a memory holding instructions executable by the microprocessor, wherein the controller receives the signal from the monitor and configures the configurable components based on the signal from the monitor in accordance with the requirements of the load.

3. The apparatus for automatically configuring a thermoelectric power generation system in accordance with the requirements of a load as recited in claim 1, wherein the temperature differential is provided by a supply of heated fluid and a sink colder than the heated fluid, and wherein the apparatus further comprises a valve that, under control of the controller, adjusts a flow rate of the heated fluid.

4. The apparatus for automatically configuring a thermoelectric power generation system in accordance with the requirements of a load as recited in claim 1, wherein the temperature differential is provided by a supply of heated fluid and a sink colder than the heated fluid, and wherein the apparatus further comprises a valve that, under control of the controller, adjusts the temperature of the heated fluid.

5. The apparatus for automatically configuring a thermoelectric power generation system in accordance with the requirements of a load as recited in claim 1, wherein the temperature differential is provided by a heated source and a supply of fluid that is colder than the heated source, and wherein the apparatus further comprises a valve that, under control of the controller, adjusts a flow rate of the supply of fluid.

6. The apparatus for automatically configuring a thermoelectric power generation system in accordance with the requirements of a load as recited in claim 1, wherein the temperature differential is provided by a heated source and a supply of fluid that is colder than the heated source, and wherein the apparatus further comprises a valve that, under control of the controller, adjusts the temperature of the supply of fluid.

7. The apparatus for automatically configuring a thermoelectric power generation system in accordance with the requirements of a load as recited in claim 1, wherein the temperature differential is provided by a supply of heated fluid and a sink colder than the heated fluid, and wherein the supply of heated fluid is heated by a solar collector, and wherein the apparatus further comprises a solar collector adjusting mechanism that adjusts the ability of the solar collector to impart heat to the heated fluid.

8. The apparatus for automatically configuring a thermoelectric power generation system in accordance with the requirements of a load as recited in claim 7, wherein the solar collector is a flat panel solar collector, and wherein the solar collector adjusting mechanism adjusts the position of a shade over the flat panel solar collector.

9. The apparatus for automatically configuring a thermoelectric power generation system in accordance with the requirements of a load as recited in claim 7, wherein the solar collector is a concentrating solar collector, and wherein the solar collector adjusting mechanism adjusts the aiming or focus of the concentrating solar collector.

10. The apparatus for automatically configuring a thermoelectric power generation system in accordance with the requirements of a load as recited in claim 1, wherein a second signal indicates the amount of power the thermoelectric generator is producing.

11. The apparatus for automatically configuring a thermoelectric power generation system in accordance with the requirements of a load as recited in claim 1, wherein a second signal indicates that the thermoelectric generator is unable to produce power in accordance with the requirements of the load.

12. The apparatus for automatically configuring a thermoelectric power generation system in accordance with the requirements of a load as recited in claim 1, wherein the bank-level matrix switch has the capability to configure the electrical interconnection of the banks by disconnecting at least one bank.

13. The apparatus for automatically configuring a thermoelectric power generation system in accordance with the requirements of a load as recited in claim 1, wherein the bank-level matrix switch has the capability to configure the electrical interconnection of the banks by placing at least one bank in series with at least one other bank.

14. The apparatus for automatically configuring a thermoelectric power generation system in accordance with the requirements of a load as recited in claim 1, wherein the bank-level matrix switch has the capability to configure the electrical interconnection of the banks by placing at least one bank in parallel with at least one other bank.

15. The apparatus for automatically configuring a thermoelectric power generation system in accordance with the requirements of a load as recited in claim 1, wherein the bank-level matrix switch has the capability to configure the electrical interconnection of the banks by placing banks in a combination of series and parallel connections.

16. The apparatus for automatically configuring a thermoelectric power generation system in accordance with the requirements of a load as recited in claim 1, wherein the power characteristic is voltage.

17. A method of automatically configuring a thermoelectric power generation system in accordance with the requirements of a load, the method comprising:
   measuring, using a monitor, a characteristic of power being supplied to the load by a thermoelectric generator, wherein the thermoelectric generator generates electric power when subjected to a temperature differential; and wherein the thermoelectric generator includes thermoelectric modules arranged in a plurality of banks, each bank comprising a plurality of thermoelectric modules;
   receiving, by a controller, a signal from the monitor, the signal communicating the measurement of the power characteristic,
   comparing the measurement of the power characteristic with a predetermined desired range for the power characteristic;
   based on the comparison, automatically dynamically reconfiguring, under control of the controller, electrical interconnections of thermoelectric modules within at least one bank and electrical interconnections of the banks, to keep the power characteristic within the predetermined range.

18. The method of automatically configuring a thermoelectric power generation system in accordance with the requirements of a load as recited in claim 17, wherein the temperature differential is provided by a heated fluid and a sink colder than the heated fluid, and the method further comprising adjusting a valve that adjusts a rate of flow of the heated fluid.

19. The method of automatically configuring a thermoelectric power generation system in accordance with the requirements of a load as recited in claim 17, wherein the temperature differential is provided by a heated fluid and a sink colder than the heated fluid, and the method further comprising adjusting a valve that adjusts the temperature of the heated fluid.

20. The method of automatically configuring a thermoelectric power generation system in accordance with the requirements of a load as recited in claim 17, wherein the temperature differential is provided by a supply of heated fluid and a sink colder than the heated fluid, and wherein the supply of heated fluid is heated by a solar collector, and the method further comprising adjusting the ability of the solar collector to impart heat to the heated fluid.

21. A method of converting thermal energy stored in a reservoir of heated fluid to electrical energy, the method comprising:
   passing heated fluid from the reservoir to a hot side of a thermoelectric generator;

cooling a cold side of the thermoelectric generator;
wherein the thermoelectric generator generates electric power when subjected to a temperature differential;
measuring, using a monitor, a characteristic of power being supplied to a load by the thermoelectric generator; and wherein the thermoelectric generator includes thermoelectric modules arranged in a plurality of banks, each bank comprising a plurality of thermoelectric modules;
receiving by a controller a signal from the monitor, the signal communicating the measurement of the power characteristic,
comparing the measurement of the power characteristic with a predetermined desired range for the power characteristic;
based on the comparison, automatically dynamically reconfiguring, under control of the controller, electrical interconnections of thermoelectric modules within at least one bank and electrical interconnections of the banks, to keep the power characteristic within the predetermined range.

22. The method of converting thermal energy stored in a reservoir of heated fluid to electrical energy as recited in claim 21, further comprising heating the heated fluid using a solar collector.

* * * * *